(12) United States Patent
Kim et al.

(10) Patent No.: US 7,321,186 B2
(45) Date of Patent: Jan. 22, 2008

(54) FRONT FILTER, AND PLASMA DISPLAY APPARATUS HAVING THE SAME

(75) Inventors: Young Sung Kim, Yongin-si (KR); Kyung Ku Kim, Seoul (KR); Hong Rae Cha, Seoul (KR); Myeong Soo Chang, Ociwhang-si (KR); Byung Gil Ryu, Seoul (KR); Eun Ho Yoo, Goyang-si (KR)

(73) Assignee: LG Electronics Inc., Seoul (KR)

( * ) Notice: Subject to any disclaimer, the term of this patent is extended or adjusted under 35 U.S.C. 154(b) by 297 days.

(21) Appl. No.: 10/812,903

(22) Filed: Mar. 31, 2004

(65) Prior Publication Data

US 2004/0198096 A1    Oct. 7, 2004

(30) Foreign Application Priority Data

Apr. 1, 2003  (KR) .................. 10-2003-0020490

(51) Int. Cl.
*H01R 13/73* (2006.01)
*H01J 61/40* (2006.01)

(52) U.S. Cl. .............. 313/112; 313/581; 313/479; 359/359; 359/885; 349/104

(58) Field of Classification Search ........ 313/581–587, 313/112, 479; 359/308, 359, 502, 588, 590, 359/885, 891; 349/104–111
See application file for complete search history.

(56) References Cited

U.S. PATENT DOCUMENTS

| 5,627,429 | A  | * | 5/1997  | Iwasaki ................ 313/474 |
| RE37,183 | E  | * | 5/2001  | Kawamura et al. ........ 313/479 |
| 6,344,710 | B2 | * | 2/2002  | Teng et al. ............. 313/479 |
| 6,429,587 | B1 | * | 8/2002  | Sugimachi et al. ....... 313/582 |
| 6,965,191 | B2 | * | 11/2005 | Koike et al. ............ 313/112 |

\* cited by examiner

*Primary Examiner*—Ashok Patel
(74) *Attorney, Agent, or Firm*—Ked & Associates, LLP

(57) ABSTRACT

Disclosed is a plasma display apparatus having the same in which an electromagnetic wave is not only shielded, but also a transmission rate can be secured. The front filter including: an electromagnetic-wave shield film having a conductive powder decentralized therein, for shielding an electromagnetic wave. At this time, in order to form the electromagnetic-wave shield film, a mixture of the conductive powder and a predetermined synthetic resin is coated on a base film.

16 Claims, 6 Drawing Sheets

FRONT FILTER, AND PLASMA DISPLAY APPARATUS HAVING THE SAME

BACKGROUND OF THE INVENTION

1. Field of the Invention

The present invention relates to a plasma display apparatus, and more particularly, to a front filter, and a plasma display apparatus having the same in which an electromagnetic wave is not only shielded, but also a transmission rate can be secured.

2. Description of the Related Art

Plasma display panel (hereinafter referred to as "PDP") generally displays an image including character or graphic by exciting phosphor using ultraviolet rays with a wavelength of 147 nm, which is generated during a gas discharge of an inert mixture gas, such as He+Xe, Ne+Xe, He+Ne+Xe or the like. This PDP has easy slimness and large-sized characteristics, and provides a greatly improved picture quality thanks to the recent technology development. In particular, three-electrode alternating current (AC) surface discharge type PDP has advantages of a low voltage operation and a long life since wall charges stored on a surface in the course of discharge protect electrodes from sputtering generated by the discharge.

FIG. 1 is a view illustrating a discharge cell of a conventional three-electrode alternating current (AC) surface discharge type plasma display panel.

Referring to FIG. 1, a discharge cell of the three-electrode AC surface discharge type PDP includes a scan electrode (Y) and a sustain electrode (Z) formed on an upper substrate 10, and an address electrode (X) formed on a lower substrate 18. Each of the scan electrode (Y) and the sustain electrode (Z) includes transparent electrodes 12Y and 12Z and metal bus electrodes 13Y and 13Z having line widths narrower than line widths of the transparent electrodes 12Y and 12Z formed at one-sided edge regions of the transparent electrodes 12Y and 12Z.

The transparent electrodes 12Y and 12Z are generally formed of Indium-Tin-Oxide (Hereinafter, referred to as "ITO") on the upper substrate 10. The metal bus electrodes 13Y and 13Z are generally formed of chrome (Cr) on the transparent electrodes 12Y and 12Z to function to reduce a voltage drop caused by the transparent electrodes 12Y and 12Z having high resistance. An upper dielectric layer 14 and a passivation film 16 are layered on the upper substrate 10 having the scan electrode (Y) and the sustain electrode (Z) formed in parallel with each other. The wall charge generated at the time of plasma discharge is stored in the upper dielectric layer 14. The passivation film 16 prevents the upper dielectric layer 14 from being damaged due to the sputtering generating at the time of the plasma discharge and also, enhances an emission efficiency of a secondary electron. Magnesium oxide (MgO) is generally used as the passivation film 16. A lower dielectric layer 22 and a barrier 24 are formed on the lower substrate 18 having the address electrode (X), and a fluorescent layer 26 is coated on a surface of the lower dielectric layer 22 and the barrier 24. The address electrode (X) is formed in a direction of crossing with the scan electrode (Y) and the sustain electrode (Z). The barrier 24 is formed in parallel with the address electrode (X) to prevent the visible ray and the ultraviolet ray caused by the discharge from being leaked to an adjacent discharge cell. The fluorescent layer 26 is excited by the ultraviolet ray generated due to the plasma discharge to radiate any one visible ray of red, green or blue. The inert mixed gas for the discharge such as He+Xe, Ne+Xe, He+Ne+Xe and the like is injected into a discharge space of the discharge cell provided between the upper/lower substrates 10 and 18 and the barrier 24.

In the PDP, one frame is divided for time-division driving into several sub-fields having different light-emitting times so as to embody a gray level of the image. Each of the sub-fields is divided into a reset period for which an entire screen is initialized, an address period for which a scan line is selected and a specific cell is selected at the selected scan line, and a sustain period for which the gray level is embodied depending on the light-emitting times.

For example, in case that the image is expressed using a 256 gray level as in FIG. 2, a frame period (16.67 ms) corresponding to 1/60 second is divided into eight sub-fields (SF1 to SF8). Also, each of the eight sub-fields (SF1 to SF8) is again divided into a reset period, an address period and a sustain period. Herein, the reset and address periods of each sub-field are identical every sub-field, while as the sustain period is increased in a ratio of $2^n$ (n=0, 1, 2, 3, 4, 5, 6, 7) at each of the sub-fields.

In the above-driven PDP, a glass-type front filter for shielding an electromagnetic interference and also preventing an external light from being reflected is installed on a front surface of the upper substrate 10.

FIG. 3 is a schematic section view illustrating a portion of a conventional plasma display apparatus.

Referring to FIG. 3, the conventional plasma display apparatus includes a panel 32 where the upper substrate 10 and the lower substrate 18 are attached to each other with a gap therebetween, a glass-type front filter 30 installed at a front surface of the panel 32, a chassis base 36 for supporting the panel 32 and also mounting a printed circuit board thereon, a heat sink plate 34 attached to a front surface of the chassis base 36, a back cover 38 installed on a rear surface of the panel 32, and a front cabinet 45 for electrically connecting the back cover 38 and the glass-type front filter 30.

The front cabinet 45 includes a filter support portion 40 for electrically connecting the glass-type front filter 30 and the back cover 38, and a support member 42 for fixing and supporting the glass-type front filter 30 and the back cover 38. The filter support portion 40 supports the glass-type front filter 30 such that a rear surface of the glass-type front filter 30 is spaced away from the panel 32. Further, the filter support portion 40 electrically connects the EMI shield film included in the glass-type front filter 30 to the back cover 38 grounded to a ground voltage source to discharge an EMI signal from the EMI shield film. Also, the filter support portion 40 prevents the EMI from being laterally emitted The printed circuit board mounted on the chassis base 36 supplies a driving signal to electrodes (for example, a scan electrode, a sustain electrode and an address electrode) of the panel 32. For this, the printed circuit board includes various driving portions not shown. The panel 32 displays a certain image in response to the driving signal supplied from the printed circuit board. The heat sink plate 34 dissipates heat generated from the panel 32 and the printed circuit board. The back cover 38 protects the panel 32 from an external impact, and also shields an electromagnetic interference (Hereinafter, referred to as "EMI") laterally emitted.

The glass-type front filter 30 shields the EMI and also, prevents an external light from being reflected. For this, the glass-type front filter 30 includes an antireflection coating 50, an EMI shield film 54 and a near infrared ray (Hereinafter, referred to as "NIR") shield film 56. The glass-type front filter 30 additionally includes a glass and a color correction film 58. Herein, an adhesive layer is formed between respective films 50, 52, 54, 56 and 58 of the glass-type front filter 30 to adhere respective films 50, 52, 54, 56 and 58 to one another. Generally, a color revision pigment is added to the adhesive layer to form the color correction film 58. At this time, a structure of the glass-type front filter 30 can be a little varied depending on providers.

The antireflection coating 50 prevents an external incident light from being reflected toward an external to improve a contrast of a plasma display panel (PDP). The antireflection coating 50 is formed on a surface of the glass-type front filter 30. Or, unlike FIG. 4, the antireflection coating 50 can be also formed on a rear surface of the glass-type front filter 30

The glass 52 supports the glass-type front filter 30 to prevent the glass-type front filter 30 from being damaged by the external impact.

The EMI shield film 54 includes a conductive mesh pattern to shield the EMI to prevent the EMI incident from the panel 32 from being emitted to the external The NIR shield film 56 shields a NIR (Near Infrared Ray) emitted from the panel 32 to prevent the NIR exceeding a reference value from being emitted toward the external such that a signal transmitting device using IR (Infrared Ray) can normally transmit a signal such as a remote controller and the like.

The color correction film 58 decreases the luminance of red (R) and green (G) of the visible ray incident from the panel 32 and also, increases the luminance of blue (B) to improve an optic characteristic of the PDP. Further, the color revision pigment is used to increase the purity of red (R), green (G) and blue (B). The NIR shield film 56 and the color correction film 58 can be single-layered.

The conventional glass-type front filter 30 uses the glass 52 so as to prevent the glass-type front filter 30 from being damaged by the external impact. This glass-type front filter is called a glass typed glass-type front filter. However, if the glass 52 is inserted into the glass-type front filter 30, there is a disadvantage in that the glass-type front filter 30 is thickened. Further, if the glass 52 is inserted into the glass-type front filter 30, there is a drawback in that the glass-type front filter 30 is increased in weight and also a manufacture cost.

Accordingly, a film-type front filter 60 without the glass 52 has been proposed as shown in FIG. 5. The film-type front filter 60 includes an antireflection coating 62, an EMI shield film 64, a NIR shield film 66 and a color correction film 68. Herein, an adhesive layer is formed between respective films 62, 64, 66 and 68 of the film-type front filter 60 to adhere the respective films 62, 64, 66 and 68 to one another The antireflection coating 62 is formed on a surface of the film-type front filter 60 to prevent an external incident light from being again reflected toward the external. Or, the antireflection coating 62 can be also formed on a rear surface of the film-type front filter 60.

The EMI shield film 64 includes a conductive mesh pattern to shield the EMI to prevent the EMI incident from the panel 32 from being emitted to the external.

The NIR shield film 66 shields the NIR emitted from the panel 32. The NIR shield film 66 prevents the NIR exceeding a reference value from being emitted toward the external such that a signal transmitting device using IR (Infrared Ray) can normally transmit a signal such as a remote controller and the like.

The color correction film 68 decreases the luminance of red (R) and green (G) of the visible ray incident from the panel 32 and also, increases the luminance of blue (B) to improve an optic characteristic of the PDP. Further, a color revision pigment is used to increase the purity of red (R), green (G) and blue (B). The NIR shield film 66 and the color correction film 68 can be single-layered.

As described above, the conventional glass-type front filter and film-type front filter can include the EMI shield film for shielding an electromagnetic wave as in FIG. 6. The EMI shield film shown in FIG. 6 has a mesh structure where a plurality of first electrode lines 71*a* and a plurality of second electrode lines 71*b* are surrounded by a frame 70 and intersected with one another. Meanwhile, the first and second electrode lines 71*a* and 71*b* are multi-layered using copper (Cu) or silver (Ag) and ITO to have a line width for allowing the transmission rate of the visible ray of the PDP to be secured enough. At this time, the line width, the line gap and the bias angle θ should be optimally set such that the transmission rate of the visible ray can be enough secured. This is because in case that the line width and the line gap are large, the transmission rate of the visible ray is reduced to deteriorate the luminance, and in case that the bias angle θ is improper. Moire phenomenon is caused to deteriorate the picture quality.

The EMI shield film is formed using at least one conductive layer of copper (Cu), silver (Ag) and ITO through a patterning process including a photolithography process. At this time, in case that the bias angle is varied, there is a drawback in that productivity is reduced since a designed value of the photolithography process should be altered. Further, when the EMI shield film formed of flexible copper (Cu), silver (Ag), ITO and the like is attached to the PDP, the mismatch of a lattice gap or the transformation of a lattice pattern is easily generated, thereby causing the bias angle is twisted. Accordingly, there is a drawback in that the transmission rate cannot be secured since the transmission rate of the visible ray of the PDP is reduced.

SUMMARY OF THE INVENTION

Accordingly, the present invention is directed to a front filter, and a plasma display apparatus having the same, that substantially obviate one or more problems due to limitations and disadvantages of the related art.

An object of the present invention is to provide a front filter, and a plasma display apparatus having the same in which an electromagnetic wave is not only shielded, but also a transmission rate can be secured Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided a front filter installed at a front of a panel in a plasma display apparatus, the front filter including: an electromagnetic-wave shield film having a conductive powder decentralized therein, for shielding an electromagnetic wave.

According to the front filter, the electromagnetic-wave shield film includes: a base film; and a coating film coated using a mixture of the conductive powder and a predetermined synthetic resin on the base film.

The front filter may further include: an optical filter film; and an adhesive layer having the conductive powder decentralized therein, for adhering the optical filter film to the electromagnatic-wave shield film.

Herein, the optical filter film may be any one of an antireflection coating, a glass, an infrared-ray shield film and a color correction film.

In another aspect of the present invention, there is provided a front filter installed at a front of a panel in a plasma display apparatus, the front filter including: at least two optical filter films; and an adhesive layer having the conductive powder decentralized therein, for adhering the at least two optical filter films to each other.

The front filter can further includes an electromagnetic-wave shield film having a conductive powder decentralized therein, for shielding an electromagnetic wave.

In a further another aspect of the present invention, there is provided a plasma display apparatus including: a panel having an upper panel and a lower panel attached to each other; a front filter being installed at a front of the panel, and having an electromagnetic-wave shield film having a conductive powder decentralized therein, for shielding an electromagnetic-wave; a sash base for fixing the panel; a backcover installed at a rear of the panel; and a front cabinet for electrically connecting the front filter with the backcover.

At this time, the front filter may be one of a glass-type front filter or a film-type front filter.

The front filter may include: an optical filter film; and an adhesive layer having the conductive powder decentralized therein, for adhering the optical filter film to the electromagnetic-wave shield film.

It is to be understood that both the foregoing general description and the following detailed description of the present invention are exemplary and explanatory and are intended to provide further explanation of the invention as claimed

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings wherever possible, the same reference numbers will be used throughout the drawings to refer to the same or like parts.

Figure 1:
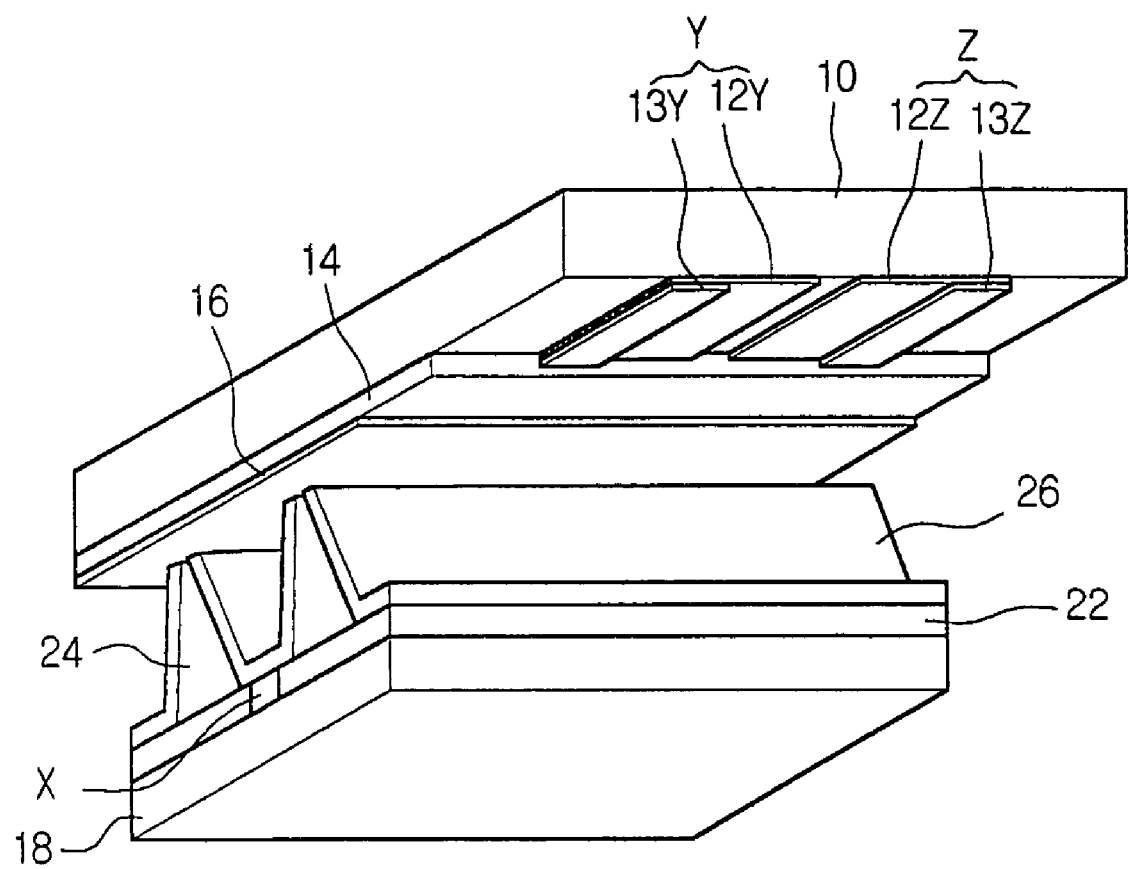
FIG. 1 is a perspective view illustrating a structure of a discharge cell of a conventional plasma display panel.
Figure 2:
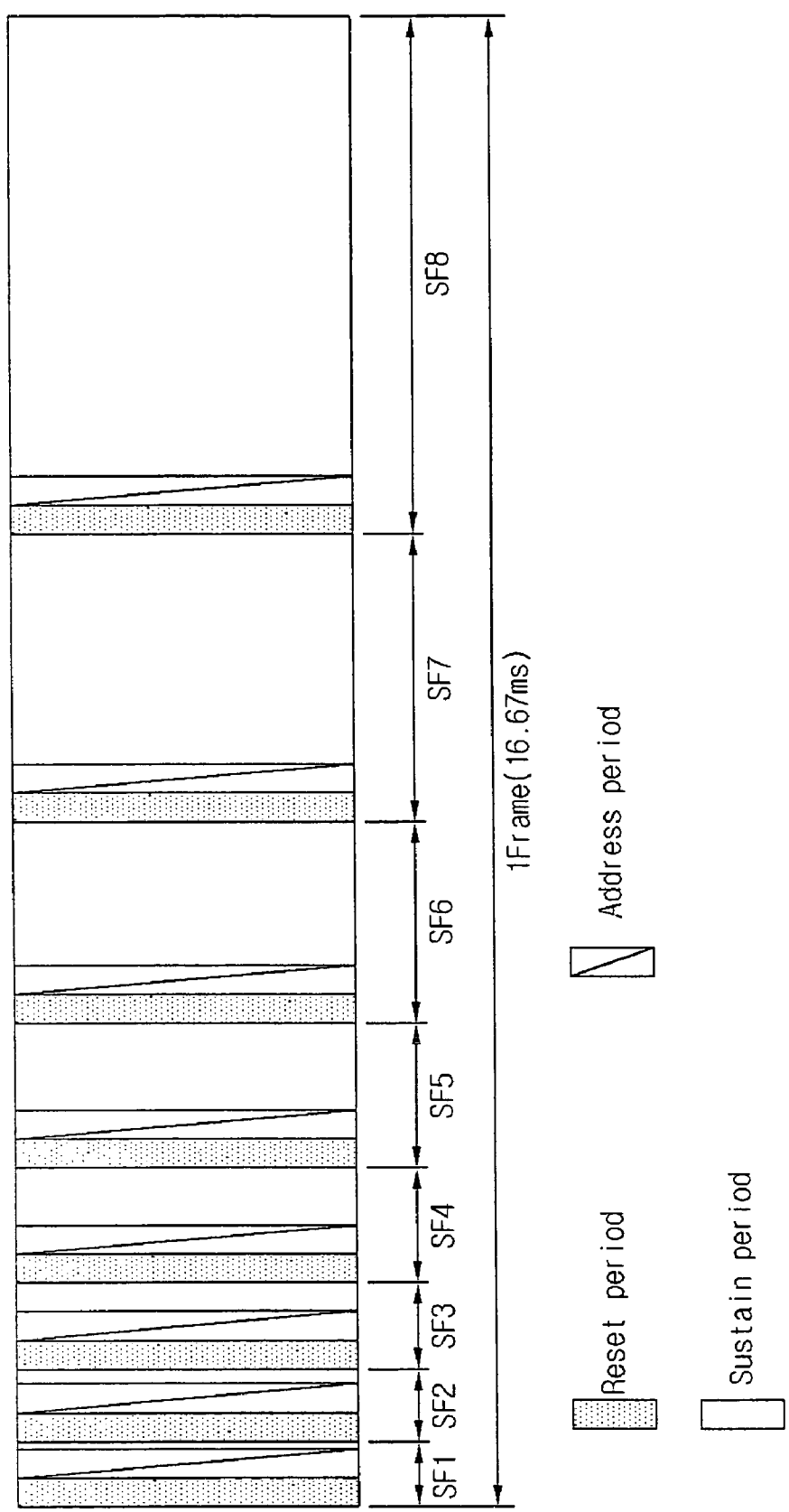
FIG. 2 is a view illustrating a frame at which a 256 gray level is expressed in a conventional plasma display panel.
Figure 3:
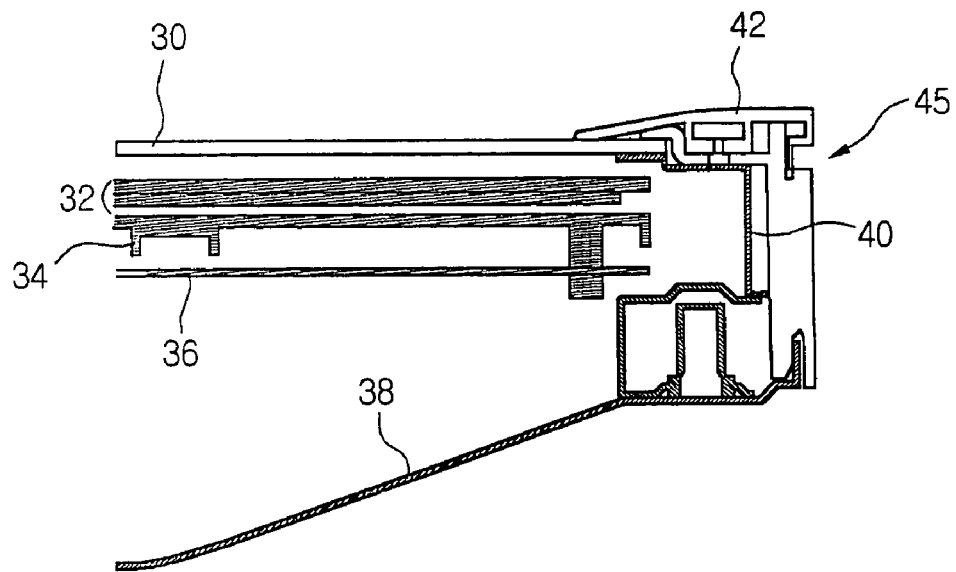
FIG. 3 is a schematic section view illustrating a portion of a conventional plasma display panel.
Figure 4:
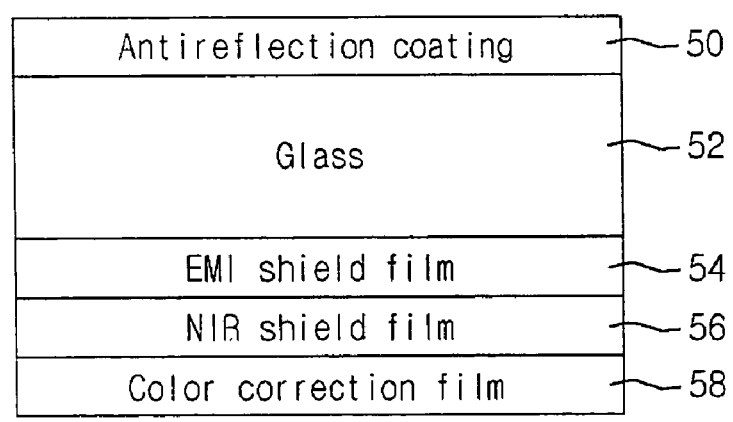
FIG. 4 is a schematic view illustrating a conventional glass-type front filter.
Figure 5:
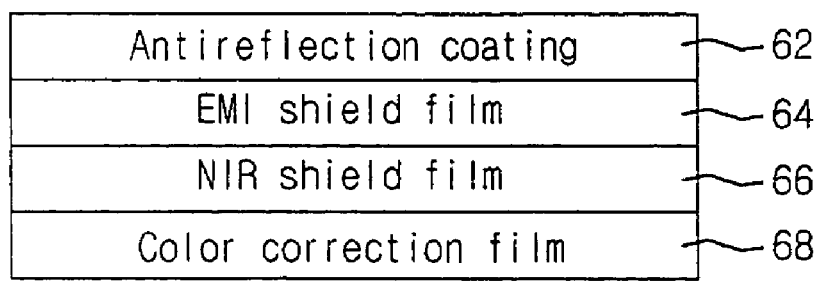
FIG. 5 is a schematic view illustrating a conventional film-type front filter.
Figure 6:
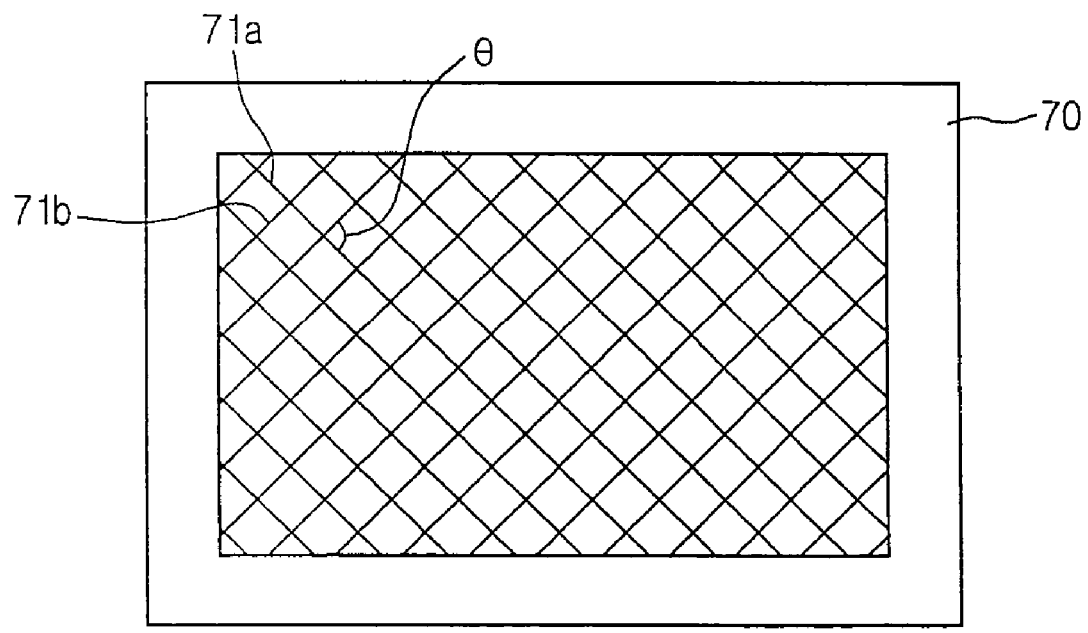
FIG. 6 is a detailed view illustrating an electromagnetic interference (EMI) shield film of conventional glass-type front filter and film-type front filter.
Figure 7:
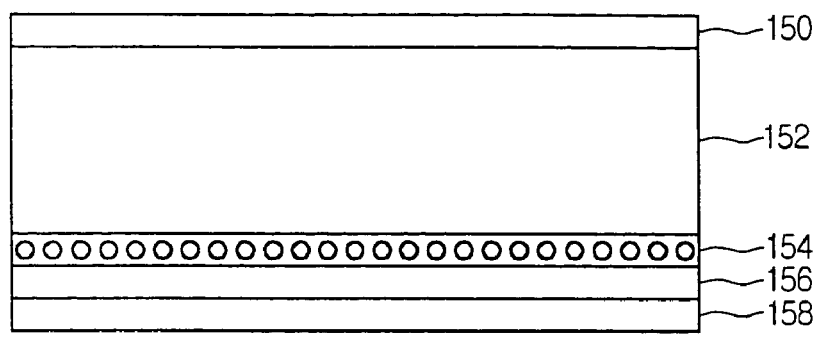
FIG. 7 is a view illustrating a glass-type front filter of a plasma display panel (PDP) according to a first embodiment of the present invention.
Figure 8:
FIG. 8 is a detailed view illustrating an electromagnetic interference shield film shown in FIG. 7.

FIG. 7 is a view illustrating a glass-type front filter of a plasma display panel (PDP) according to a first embodiment of the present invention.

Referring to FIG. 7, the glass-type front filter 130 of the PDP according to the first embodiment of the present invention includes an antireflection coating 150, an EMI shield film 154, a NIR shield film 156 and a color correction film 158. Herein, an adhesive layer not shown is formed between respective films 150, 152, 154, 156 and 158 of the glass-type front filter 130 to adhere the respective films 150, 152, 154, 156 and 158 to one another.

The antireflection coating 150 prevents an external incident light from being again reflected toward an external to improve a contrast of the PDP. The antireflection coating 150 is formed on a surface of the glass-type front filter 130. Or, the antireflection coating 150 can be also formed on a rear surface of the glass-type front filter 130.

The glass 152 supports the glass-type front filter 130 so as to prevent the glass-type front filter 130 from being destroyed by an external impact.

The EMI shield film 154 shields the EMI to prevent the EMI incident from the panel from being emitted to the external. The EMI shield film 156 includes a base film 155 and a coating film 153 formed by coating a conductive powder on an upper surface of the base film 155. At this time, the conductive powder has a size of several numbers to several hundreds nm, and can be also at least any one low resistance material of copper (Cu), silver (Ag), gold (Au), aluminum (Al), nickel (Ni), platinum (Pt), carbon nanotube (CNT) and the like.

The above EMI shield film 154 can shield an electromagnetic wave without a separate conductive electrode line since the conductive powder is mixed with a synthetic resin to be coated on the upper surface of the base film 155. Further, the conductive powder is prepared to have the wavelength region of the visible ray of below 380 nm. Since the wavelength region is less than the wavelength region of visible ray generated at the panel, the transmission rate of the visible ray generated at the panel can be enough secured without reduction. Meanwhile, in case that the conductive powder is mixed with the synthetic resin to be coated on the upper surface of the base film 155, its concentration of about 1-40% of the synthetic resin by a volume ratio is appropriate considering the transmission rate.

The NIR shield film 156 shields the NIR emitted from the panel 32 to prevent the NIR exceeding a reference value from being emitted toward the external such that a signal transmitting device using IR (Infrared Ray) can normally transmit a signal such as a remote controller and the like.

The color correction film 158 decreases the luminance of red (R) and green (G) of the visible ray incident from the panel 32 and also, increases the luminance of blue (B) to improve an optic characteristic of the PDP. Further, a color revision pigment is used to increase the purity of red (R), green (G) and blue (B). The NIR shield film 156 and the color correction film 158 can be single-layered.

Figure 9:
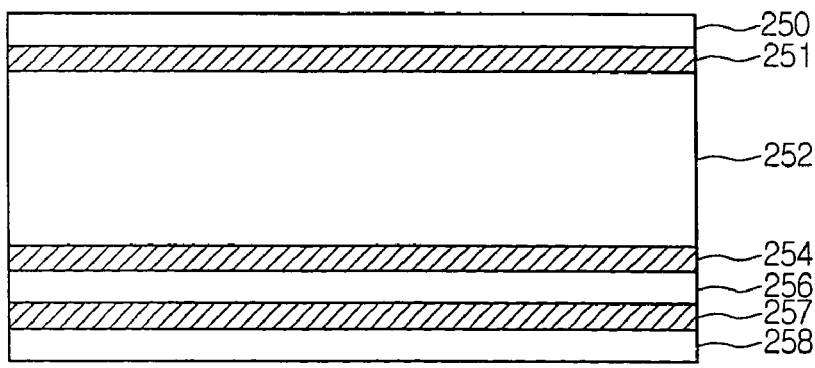
FIG. 9 is a view illustrating a glass-type front filter of a PDP according to a second embodiment of the present invention.

FIG. 9 is a view illustrating a glass-type front filter of a PDP according to a second embodiment of the present invention.

Referring to FIG. 9, the glass-type front filter 230 of the PDP according to the second embodiment, of the present invention includes an antireflection coating 250, a glass 252, a NIR shield film 256 and a color correction film 258. Herein, it additionally includes a first adhesive layer 251 for adhering the antireflection coating 250 to the glass 252, a second adhesive layer 254 for adhering the glass 252 to the NIR shield film 256, and a third adhesive layer 257 for adhering the NIR shield film 256 to the color correction film 258. At this time, a conductive powder can be decentralized in the second adhesive layer 254 to shield electromagnetic wave.

The antireflection coating 250 prevents an external incident light from being again reflected toward an external to improve a contrast of the PDP. The antireflection coating 250 is formed on a surface of the glass-type front filter 230. Or, the antireflection coating 250 can be also formed on a rear surface of the glass-type front filter 230.

The class 252 supports the glass-type front filter 230 so as to prevent the glass-type front filter 230 from being destroyed by an external impact.

The second adhesive layer 254 not only adhere the glass 252 and the NIR shield film 256 to each other, but also the conductive powder is mixed with an adhesive agent for decentralization to shield the electromagnetic wave. At this time, the conductive powder has a size of several numbers to several hundreds nm, and can be also at least any one low resistance material of copper (Cu), silver (Ag), gold (Au), aluminum (Al), nickel (Ni), platinum (Pt), carbon nanotube (CNT) and the like.

The above second adhesive layer 254 can shield the electromagnetic wave without a separate conductive electrode line since the conductive powder is decentralized. Further, the conductive powder is prepared to have the wavelength region of she visible ray of below 380 nm. Since the wavelength region is less than the wavelength region of visible ray generated at the panel, the transmission rate of the visible ray generated at the panel can be enough secured without reduction. Meanwhile, in case that the conductive powder is decentralized in the second adhesive layer 254, its concentration of about 1-40% of the adhesive agent by a volume ratio is appropriate considering the transmission rate.

The NIR shield film 256 shields the NIR emitted from LC) the panel 32 to prevent the NIR exceeding a reference value from being emitted toward the external such that a signal transmitting device using IR (Infrared Ray) can normally transmit a signal such as a remote controller and the like.

The color correction film 258 decreases the luminance of red (R) and green (G) of the visible ray incident from the panel 32 and also, increases the luminance of blue (B) to improve an optic characteristic of the PDP. Further, a color revision pigment is used to increase the purity of red (R), green (G) and blue (B). The NIR shield film 256 and the color correction film 258 can be single-layered.

Meanwhile, in the glass-type front filter according to the present invention, the EMI shield film can be formed by coating the mixture of the synthetic resin and the conductive powder on an upper surface of the base film and then, decentralizing the conductive powder in the adhesive layer for adhering the mixture to an optical filter film.

Figure 10:
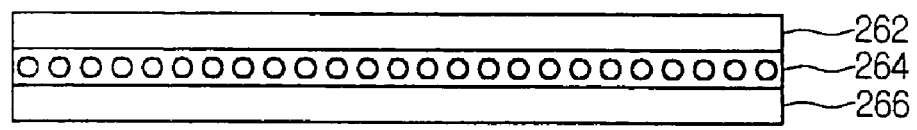
FIG. 10 is a view illustrating a film-type front filter of a PDP according to a third embodiment of the present invention.
Figure 11:
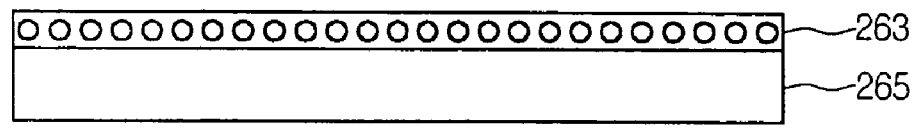
FIG. 11 is a detailed view illustrating an electromagnetic interference shield film shown in FIG. 10.

FIG. 10 is a view illustrating a film-type front filter of a PDP according to a third embodiment of the present invention.

Referring to FIG. 10, the film-type front filter 260 of the PDP according to the third embodiment of the present invention includes an antireflection coating 262, an EMI shield film 264 and a NIR shield film 266. Herein, an adhesive layer not shown is formed between respective films 262, 264 and 266 of the film-type front filter 260 to adhere the respective films 262, 264 and 266 to one another.

The antireflection coating 262 prevents an external incident light from being again reflected toward an external to improve a contrast of the PDP. The antireflection coating 262 is formed on a surface of the film-type front filter 260. Or, the antireflection coating 262 can be also formed on a rear surface of the glass-type front filter 260.

The EMI shield film 264 shields the EMI to prevent the EMI incident from the panel from being emitted to the external. The EMI shield film 264 includes a base film 265 and a coating film 153 formed by coating a conductive powder on an upper surface of the base film 265. At this time, the conductive powder has a size of several numbers to several hundreds nm, and can be also at least any one low resistance material of copper (Cu), silver (Ag), gold (Au), aluminum (Al), nickel (Ni), platinum (Pt), carbon nanotube (CNT) and the like.

The above EMI shield film 264 can shield an electromagnetic wave without a separate conductive electrode line since the conductive powder is mixed with a synthetic resin to be coated on the upper surface of the base film 265. Further, the conductive powder is prepared to have the wavelength region of the visible ray of below 380 nm. Since the wavelength region is less than the wavelength region of visible ray generated at the panel, the transmission rate of the visible ray generated at the panel can be enough secured without reduction. Meanwhile, in case that the conductive powder is mixed with the synthetic resin to be coated on the upper surface of the base film 265, its concentration of about 1-40% of the synthetic resin by a volume ratio is appropriate considering the transmission rate.

The NIR shield film 266 shields the NIR emitted from the panel 32 to prevent the NIR exceeding a reference value from being emitted toward the external such that a signal transmitting device using IR (Infrared Ray) can normally transmit a signal such as a remote controller and the like.

Figure 12:
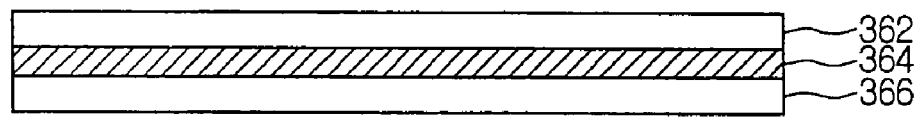
FIG. 12 is a view illustrating a film-type front filter of a PDP of a fourth embodiment of the present invention.

FIG. 12 is a view illustrating a film-type front filter of a PDP of a fourth embodiment of the present invention.

Referring to FIG. 12, the film-type front filter 360 of the PDP according to the fourth embodiment of the present invention includes an antireflection coating 362, an adhesive layer 364 and a NIR shield film 366. Herein, the adhesive layer 364 adheres the antireflection coating 362 to the NIR shield film 366. At this time, a conductive powder can be decentralized in the adhesive layer 364 to shield electromagnetic wave.

The antireflection coating 362 prevents an external incident light from being again reflected toward an external to improve a contrast of the PDP. The antireflection coating 362 is formed on a surface of the film-type front filter 360. Or, the antireflection coating 362 can be also formed on a rear surface of the film-type front filter 360.

The adhesive layer 364 not only adhere the antireflection coating and the NIR shield film 366 to each other, but also the conductive powder is mixed with an adhesive agent for decentralization to shield the electromagnetic wave. At this time, the conductive powder has a size of several numbers to several hundreds nm, and can be also at least any one low resistance material of copper (Cu), silver (Ag), gold (Au), aluminum (Al), nickel (Ni), platinum (Pt), carbon nanotube (CNT) and the like The above adhesive layer 364 can shield the electromagnetic wave without a separate conductive electrode line since the conductive powder is decentralized. Further, the conductive powder is prepared to have the wavelength region of the visible ray of below 380 nm. Since the wavelength region is less than the wavelength region of visible ray generated at the panel, the transmission rate of the visible ray generated at the panel can be enough secured without reduction. Meanwhile, in case that the conductive powder is decentralized in the adhesive layer 364, its concentration of about 1-40% of the adhesive agent by a volume ratio is appropriate considering the transmission rate.

The NIR shield film 366 shields the NIR emitted from the panel 32 to prevent the NIR exceeding a reference value from being emitted toward the external such that a signal transmitting device using IR (Infrared Ray) can normally transmit a signal such as a remote controller and the like.

Meanwhile, in the film-type front filter according to the present invention, the EMI shield film can be formed by coating the mixture of the synthetic resin and the conductive powder on an upper surface of the base film and then, decentralizing the conductive powder in the adhesive layer for adhering the mixture to an optical filter film.

As described above, in the front filter of the PDP according to the embodiment of the present invention, the conductive powder having the size of several numbers—several hundreds nm is decentralized in the adhesive layer of the front filter to form an electromagnetic-wave shield film or the mixture of the conductive powder and the synthetic resin is coated on the base film to form the electromagnetic-wave shield film such that the electromagnetic wave can be not only shielded, but also the transmission rate can be secured.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A front filter for a plasma display apparatus, the front filter comprising:
at least two optical filter films coupled over a surface of a plasma display panel; and
an adhesive layer for adhering the at least two optical filter films to each other, the adhesive layer including a conductive powder to shield electromagnetic waves, said conductive powder decentralized in the adhesive layer to within a predetermined concentration range by volume ratio relative to an amount of adhesive agent in the adhesive layer, said predetermined concentration range set to allow the plasma display panel to achieve a desired transmission rate.

2. The front filter according to claim 1, wherein the predetermined concentration range of the conductive powder is 1-40% of the adhesive agent by volume ratio.

3. The front filter according to claim 1, wherein the at least two optical filter films are an antireflection coating and an infrared-ray shield film.

4. The front filter according to claim 1, wherein the conductive powder is formed of any one of copper (Cu), silver (Ag), gold (Au), aluminum (Al), nickel (Ni), platinum (Pt), and carbon nanotube (CNT).

5. The front filter according to claim 1, wherein the conductive powder has a particle size of between several nm to 380 nm.

6. The front filter according to claim 1, wherein the predetermined concentration range of the conductive powder is set to allow the plasma display panel to transmit visible rays in the range above 380 nm.

7. The front filter according to claim 1, wherein the front filter is a film-type filter.

8. The front filter according to claim 1, wherein the front filter includes a glass layer.

9. The front filter according to claim 1, wherein the adhesive agent includes a synthetic resin.

10. A front filter for a plasma display apparatus, comprising:
at least two layers coupled to transmit light generated from a plasma display panel; and
an adhesive layer between the two layers and including a conductive powder to shield electromagnetic waves, wherein the conductive powder is dispersed throughout the adhesive layer to within a predetermined concentration range by volume ratio relative to an amount of adhesive agent in the adhesive layer, said predetermined concentration range set to allow the plasma display panel to achieve a desired transmission rate.

11. The front filter according to claim 10, wherein each of the two layers includes an optical filter film.

12. The front filter according to claim 11, wherein the at least two layers are an antireflection coating and, an infrared-ray shield film.

13. The front filter according to claim 10, wherein the predetermined concentration range of the conductive powder is 1-40% of the adhesive agent by volume ratio.

14. The front filter according to claim 10, wherein the conductive powder is formed of any one of copper (Cu), silver (Ag), gold (Au), aluminum (Al), nickel (Ni), platinum (Pt), and carbon nanotube (CNT).

15. The front filter according to claim 10, wherein the conductive powder has a particle size of between several nm to 380 nm.

16. The front filter according to claim 10, wherein the predetermined concentration range of the conductive powder is set to allow the plasma display panel to transmit visible rays in the range above 380 nm.

* * * * *